(12) United States Patent
Kilzer et al.

(10) Patent No.: US 10,649,487 B2
(45) Date of Patent: May 12, 2020

(54) FAIL-SAFE CLOCK MONITOR WITH FAULT INJECTION

(71) Applicant: Microchip Technology Incorporated, Chandler, AZ (US)

(72) Inventors: Kevin Kilzer, Chandler, AZ (US); Aditya Nukala, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/143,841

(22) Filed: Sep. 27, 2018

(65) Prior Publication Data

US 2020/0012313 A1    Jan. 9, 2020

Related U.S. Application Data

(60) Provisional application No. 62/694,112, filed on Jul. 5, 2018.

(51) Int. Cl.
| | |
|---|---|
| *G06F 1/04* | (2006.01) |
| *G06F 11/16* | (2006.01) |
| *G06F 1/14* | (2006.01) |
| *G06F 1/10* | (2006.01) |
| *G06F 1/08* | (2006.01) |

(52) U.S. Cl.
CPC .................. *G06F 1/14* (2013.01); *G06F 1/04* (2013.01); *G06F 1/08* (2013.01); *G06F 1/10* (2013.01); *G06F 11/1604* (2013.01)

(58) Field of Classification Search
CPC ..... G06F 1/14; G06F 1/08; G06F 1/10; G06F 11/1604; G06F 11/0751; G06F 1/04
See application file for complete search history.

(56) References Cited

U.S. PATENT DOCUMENTS

| 9,336,074 B2* | 5/2016 | Chebruch ................. G06F 1/04 |
| 9,897,651 B2* | 2/2018 | Bansal ...................... G06F 1/04 |
| 2011/0234417 A1 | 9/2011 | Aleman et al. ................ 340/660 |
| 2012/0044000 A1 | 2/2012 | Hsieh et al. ................... 327/156 |
| 2015/0033101 A1 | 1/2015 | Chebruch et al. ............ 714/798 |
| 2017/0255223 A1 | 9/2017 | Bansal et al. |

OTHER PUBLICATIONS

International Search Report and Written Opinion, Application No. PCT/US2019/039371, 14 pages, dated Sep. 27, 2019.

* cited by examiner

*Primary Examiner* — Dinh T Le
(74) *Attorney, Agent, or Firm* — Slayden Grubert Beard PLLC

(57) ABSTRACT

A system for testing a clock monitor includes a fault injection circuit, a control circuit, and a clock monitor circuit to evaluate a clock source signal from a clock source. The fault injection circuit is to modify or replace the clock source signal from the clock source to yield a modified clock signal, and send the modified clock signal to the clock monitor circuit. The clock monitor circuit is to receive an input clock signal, determine whether the input clock signal indicates a faulty clock source, and issue a clock corrective action if the input clock signal indicates a faulty clock source. The control circuit is to monitor for the clock corrective action, and determine, based on whether the clock corrective action is issued, whether the clock monitor circuit is operating correctly.

20 Claims, 3 Drawing Sheets

FAIL-SAFE CLOCK MONITOR WITH FAULT INJECTION

PRIORITY

This application claims priority to U.S. Provisional Application No. 62/694,112 filed Jul. 5, 2018, the contents of which are hereby incorporated in their entirety.

TECHNICAL FIELD

The present disclosure relates to methods and systems for clock monitoring and, more particularly, to a fail-safe clock monitor (FSCM) with fault injection.

BACKGROUND

A FSCM may be included in various systems for monitoring whether an oscillator or a clock has failed. Oscillators may include oscillators internal or external to a chip, die, processor, or other electronic device. Internal oscillators may be R-C based and therefore have high tolerances and low temperature stability. External oscillators may be circuit-based, quartz-based, or crystal-based, and a signal from the oscillator may be routed to an external pin of the electronic device. External oscillators may be more reliable, stable, and precise sources of clock frequency, but may be subject to assembly errors and printed circuit board damage.

Oscillators may experience various faults. For example, an oscillator may fail to start up, may fail to lock into phase, or may experience a power failure. A connection from the oscillator to its intended targets may fail and thus the oscillator may merely appear to fail. Load capacitance may cause faults. Each quartz crystal may be designed for a specific load capacitance. Capacitors may be used between a pin of the quartz crystal and ground. During oscillation, electric charge flows from a capacitor through the quartz and into another and back again. The attached capacitors may need to match the crystal's internal capacitance for a stable and precise oscillation. Given a specific load capacitance identified by designers of the oscillators, the crystal may oscillate with the specified frequency. If the load is too low, the crystal might not start oscillating, as there is insufficient electric charge to oscillate between the capacitors and the crystals. If the load is too high, the voltage swing of the oscillation may be reduced because of the additional charge in the capacitors that cannot flow through the crystal. A pin can form a parasitic capacitance, which can increase if sockets are used. The copper lines or leads of a printed circuit board can add parasitic capacitance. These capacitances might need to be subtracted from the load capacitors' values to match the required load. If parasitic capacitance increases or decreases, performance of the crystal may suffer.

SUMMARY

Embodiments of the present disclosure include an apparatus. The apparatus may include a fault injection circuit, a control circuit and a clock monitor circuit configured to evaluate a clock source signal from a clock source. The fault injection circuit may be configured to modify or replace the clock source signal from the clock source to yield a modified clock signal, and to send the modified clock signal to the clock monitor circuit. The clock monitor circuit may be configured to receive an input clock signal, determine whether the input clock signal indicates a faulty clock source, and issue a clock corrective action based upon a determination that the input clock signal indicates a faulty clock source. The control circuit may be configured to monitor for the clock corrective action, and determine based on whether the clock corrective action is issued whether the clock monitor circuit is operating correctly. In combination with any of the above embodiments, the control circuit may be further configured to determine that the clock monitor is operating correctly based upon the clock monitor circuit issuing the clock corrective action.

In combination with any of the above embodiments, one or more peripheral circuits may be configured to use the clock source signal while the fault injection circuit sends the modified clock signal to the clock monitor circuit.

In combination with any of the above embodiments, the fault injection circuit may be further configured to selectively modify or replace the clock source signal from the clock source to yield a modified clock signal based upon a clock monitor testing mode for the system, wherein the clock monitor circuit is to be tested during the clock monitor testing mode.

In combination with any of the above embodiments, the control circuit may be further configured to monitor for the clock corrective action and determine whether the clock monitor circuit is operating correctly based upon the clock monitor testing mode.

In combination with any of the above embodiments, the clock monitor circuit may be configured to evaluate the modified clock signal as its input clock signal during the clock monitor testing mode.

In combination with any of the above embodiments, the fault injection circuit may be further configured to selectively forward the clock source signal instead of the modified clock signal to the clock monitor circuit in a pass-through mode.

In combination with any of the above embodiments, during the pass-through mode the control circuit may be further configured to determine, from clock corrective action issued by the clock monitor circuit, that the clock source is faulty.

In combination with any of the above embodiments, the clock monitor circuit may be configured to evaluate the clock source signal as its input clock signal during the pass-through mode.

In combination with any of the above embodiments, the control circuit may be configured to suppress clock corrective action to be taken on other elements of the system based upon the clock monitor circuit issuing the clock corrective action after evaluating the modified control signal.

Embodiments of the present disclosure may include a system, electronic device, or microcontroller including any of the apparatuses of the above embodiments.

Embodiments of the present disclosure may include methods performed by any of the apparatuses, systems, electronic devices, or microcontrollers of the above embodiments.

DETAILED DESCRIPTION

Figure 1:
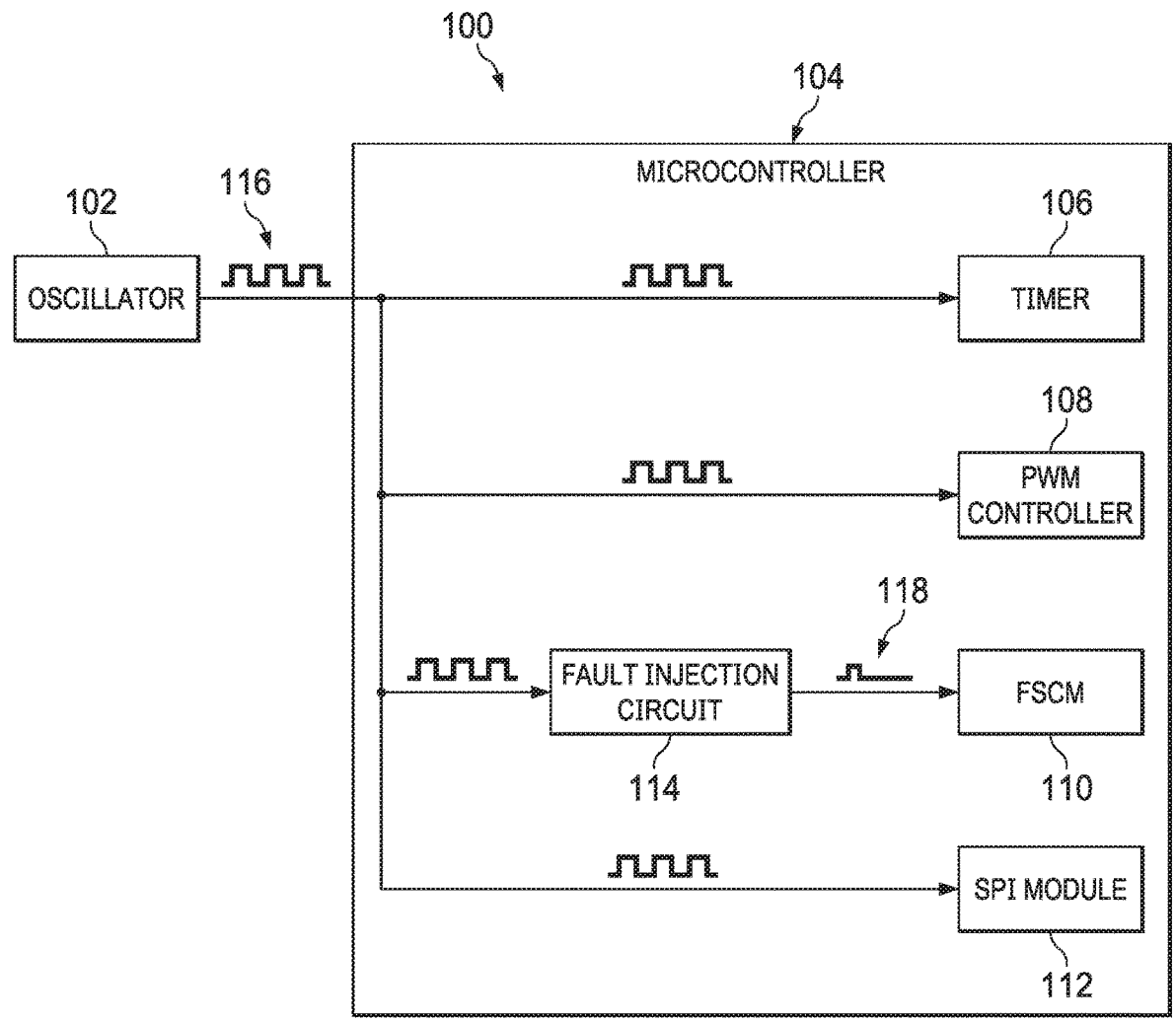
FIG. 1 illustrates a system including an FSCM with fault injection, according to embodiments of the present disclosure.

FIG. 1 illustrates a system 100 including an FSCM with fault injection, according to embodiments of the present disclosure. The FSCM with fault injection may be implemented in any suitable system. For example, system 100 may include a microcontroller, automobile, mobile device, computer, smartphone, consumer electronics, or other electronic devices. The FSCM may be configured to monitor a clock signal of an oscillator to determine whether the oscillator is working properly. In one embodiment, the fault injection may insert an artificial, simulated, or emulated fault into a clock signal. In a further embodiment, the FSCM may be configured to detect the fault and issue a notification or other corrective action based upon the detected fault. In yet a further embodiment, other parts of the system may be configured to suppress corrective action upon determination of a fault by the FSCM when fault injection has issued the fault, rather than the fault arising from actual failure of the oscillator. In another embodiment, other elements depending upon the same oscillator may continue to operate normally with the unaltered clock signal from the same oscillator while the FSCM perceives a fault.

For example, system 100 may include an oscillator 102. Oscillator 102 may be an external oscillator with respect to, for example, microcontroller 104. In other examples, oscillator 102 may be an internal oscillator with respect to microcontroller 104. Oscillator 102 may be configured to generate a clock signal 116. Clock signal 116 may be used by various elements of microcontroller for timing, to execute cycles of execution, or other suitable purposes. Oscillator 102 may be implemented in any suitable manner, such as by a crystal, driver circuit, and other combinations of digital or analog circuitry, wherein a periodic clock signal is generated.

System 100 may include an FSCM 110. FSCM 110 may be implemented by any suitable combination of circuitry, digital logic, application specific integrated circuit (ASIC), field programmable gate array (FPGA), instructions for execution by a processor, firmware, or other hardware. FSCM 110 may be implemented as an internal peripheral (IP) for a microcontroller such as microcontroller 104. FSCM 110 may serve microcontroller 104 or another system.

In one embodiment, FSCM 110 may be configured to evaluate whether a received clock signal is faulty. If the clock signal is faulty, then the source may be identified as faulty. The results of an incorrect clock signal might be disastrous, as system 100 may be controlling critical operations or processes. The failure of, for example, PWM controller 108 controlling a speed of revolution of an automobile part because of a faulty clock signal is dangerous. Upon determining that a clock signal is faulty, FSCM 110 may generate an interrupt, set a register, or take other corrective action or notifications. System 100 may in turn use such notifications to take further corrective action. For example, if FSCM 110 detects that a clock signal is faulty, a processor or interrupt handler circuit of system 100 may be configured to issue commands to a motor driver that uses the clock signal to slowly ramp down usage. Other elements dependent upon that motor may take further corrective action. In another example, warning lights may be issued to users of system 100. Software executing on microcontroller 104 may be notified and take corrective action specific to the application. In yet another example, a back-up, secondary, or other oscillator may be rerouted to peripherals that otherwise would use the output of oscillator 102.

System 100 may include any suitable number and kind of instances of FSCM 110. For example, an instance of FSCM 110 may be included for each oscillator of system 100. In another example, an instance of FSCM 110 configured to check multiple clock signals may be included if system 100 include multiple oscillators. FSCM 110 may be configured to check internal or external oscillators.

FSCM 110 may use any suitable criteria to determine whether or not a given clock signal is faulty. The criteria may be defined by registers, commands, or hard-coded into FSCM 110. For example, a clock signal may have too low or too high of a frequency. FSCM 110 may include counters or other frequency detection to identify the frequency of the received clock signal. Thus, a clock signal might still be oscillating, but at a skewed or altered rate. In such a case, FSCM 110 may determine that the clock signal is faulty. Oscillator 102 may be improperly configured such that it is issuing a clock signal with a frequency that is too high or too low. FSCM 110 may be configured to identify a flat line of the clock signal, whether high or low. Such a case may indicate that oscillator 102 has stopped working altogether, or that communication with oscillator 102 has been completely interrupted. In yet another example, a clock signal may have an improper duty cycle, wherein the duty cycle is too long or too short. During normal operation, wherein testing of FSCM 110 is not engaged, FSCM 110 may receive clock signal 116 and evaluate its integrity.

Microcontroller 104 may include various other IPs that utilize clock signal 116. Microcontroller 104 may include any suitable number and kind of such elements. For example, microcontroller 104 may include a timer circuit 106, a pulse width (PWM) modulation controller 108, or a serial peripheral interface (SPI) module 112. These other elements may depend upon the correct operation of clock signal 116. Clock signal 116 issued by oscillator 102 or otherwise received at microcontroller 104 may be issued to these peripherals. If clock signal 116 is interrupted, these other peripherals might not work correctly. Thus, clock signal 116 cannot be interrupted for testing during operation of the other peripherals.

In one embodiment, system 100 may be configured to test FSCM 110. In another embodiment, system 100 may be configured to test FSCM 110 during normal operation of microcontroller 104. In such normal operation, peripherals such as peripherals 106, 108, 112 may continue to perform their tasks FSCM 110 is tested. Such performance may include use of clock signal 116, unaltered. Correct operation of FSCM 110 may provide assurance that oscillator 102 is working correctly. If FSCM 110 fails or is working incorrectly, then a faulty clock signal might be unknowingly used by system 100. If the clock failure cannot be detected because FSCM 110 has itself failed, these dangerous conditions may arise. Thus, not only does system 100 include a check for the clock signal in the form of FSCM 110, system 100 may be configured to also include test mechanisms for testing FSCM 110. Correct operation of FSCM 110 may provide assurance that oscillator 102 is operating correctly and that, if oscillator 102 is not operating correctly, that corrective actions may be taken to prevent harm to system 100 or users of system 100. When FSCM 110 detects a failure of oscillator 102, corrective action may be taken by Failure of the clock may result in the system not operating correctly. The system or users of the system need to be aware that the clock has failed so that, for example, motors may be shut down or slowed.

Accordingly, in one embodiment, system 100 may perform a test, debugging, or other evaluations of the viability of FSCM 110. In a further embodiment, such evaluations may be made while elements of system 100 are otherwise operating while using the same clock signal 116 of oscillator 102 that FSCM 110 is to evaluate. While the system is operating, clock signal 116 of oscillator 102 may continue to be used by parts of system 100 other than FSCM 110.

Other solutions for testing a clock monitor may include stopping or altering the oscillator to be tested. As a result, such a test might not be performed while the system is otherwise running. If such a test was performed while the system is otherwise running, other parts of the system may fail without the use of the clock. Thus, such a test might be performed in other solutions in a particular test or debug mode, such as at Built-in System Test (BIST), start-up, or another time in which operation of the system is reserved for testing the clock or the clock monitor. Other peripherals running off the same oscillator that is to be interrupted would be disrupted by stopping the oscillator. Thus, the test cannot be performed when such other peripherals are to be running correctly. In contrast, embodiments of the present disclosure may facilitate testing of FSCM 110 simultaneously while other parts of system 100, such as processors or peripherals 106, 108, 112, are operating and using clock signal 116 from oscillator 102.

In one embodiment, system 100 may include a fault injection circuit (FI) 114. FI 114 may be configured to test operation of FSCM 110. FI 114 may be placed between a source of the clock signal to be tested and FSCM 110. System 100 may include any suitable number and kin of instances of FI 114. For example, if multiple instances of FSCM 110 are to be used in system 100, then an instance of FI 114 may be placed between each such instance of FSCM 110 and a source of the clock signal to be tested.

FI 114 may be configured to receive clock signal 116 from oscillator 102. In one embodiment, FI 114 may be configured to selectively and conditionally issue clock signal 116 or modified clock signal 118 to FSCM 110. FI 114 may be configured to operate in a pass-through mode and in a FSCM-test mode. In a pass-through mode, FI 114 may be configured to route clock signal 116 to FSCM 110. In such a pass-through mode, FSCM 110 may be configured to evaluate clock signal 116 as a representation of operation of oscillator 102 and monitor this signal on behalf of other peripherals. In a FSCM-test mode, FI 114 may be configured to alter or stop clock signal 116 and route, instead, modified clock signal 118 to FSCM 110. Modified clock signal 118 may be implemented in any form that will cause FSCM 110 to believe that its received clock signal is faulty. In the FSCM-test mode, FSCM 110 may be unaware that FSCM 110 is being tested. FSCM 110, detecting the faulty nature of modified clock signal 118 according to the prescribed criteria, will correctly diagnose the apparently faulty signal if FSCM 110 is working correctly. However, if FSCM 110 is not working correctly, FSCM 110 might not identify modified clock signal 118 as faulty.

FSCM 110 may be configured to generate a notification or corrective action upon determining that its clock signal is faulty. In one embodiment, during FSCM-test mode, system 100 may intercept, modify, or suppress such a notification or corrective action generated by FSCM 110. The corrective action might otherwise unnecessarily shut down or modify operation of parts of system 100 such as peripherals 106, 108, 112. In another embodiment, during FSCM-test mode, system 100 may determine whether or not FSCM 110 generated a correct identification of the faulty nature of modified clock signal 118. If FSCM 110 did generate a correct identification, then operation of FSCM 110 may be validated. If FSCM 110 did not generate a correct identification, then system 100 may be configured to determine that FSCM 110 is itself faulty, not working, or incorrectly configured. Corrective action for faulty operation of FSCM 110 may be taken. For example, an interrupt may be generated to system software.

Evaluation of performance of FSCM 110 during FSCM-test mode may be performed by any suitable entity of system 100. For example, evaluation of performance of FSCM 110 during FSCM-test mode may be performed by FI 114, a debug circuit, an interrupt handler circuit or software, a processor of microcontroller 104. An instance of such an entity may implement control circuit 202 of FIG. 2.

FSCM-test mode and the parameters of its performance may be set in any suitable manner. For example, registers that are programmable by software may be used to enable or disable FSCM-test mode or pass-through mode, frequency of its occurrence, the type of modified clock signal 118 to use, or which instances of oscillator 102 and FSCM 110 to test. These may be set by, for example system 100, software running on system 100, upon user request, or by test or debug circuits or subsystems.

FI 114 may be implemented in any suitable manner, such as by digital logic, analog circuitry, instructions for execution by a processor, or any other suitable combination of circuitry. FI 114 may include a source of modified clock signal 118, or may be configured to receive or route modified clock signal 118 from another source. For example, FI 114 may include an input for an oscillator that includes a frequency that is too high or low compared to the expected frequency at FSCM 110. FI 114 might inject a one Hertz clock signal into the clock signal bus. FI might inject a clock signal that includes a frequency that is too high, representing an overclocked source. In another example, FI 114 may include a high or low reference voltage input, representing a flat line clock. The line may be high, low, or mid-state (neither representing a zero or one), depending upon the default state that FSCM 110 would expect. FI 114 may include a periodic signal that has a duty cycle that is too long or too short. These inputs may each represent a fault and be routed as modified clock signal 118 during FSCM-test mode. In yet another example, FI 114 may actually modify, rather than simply replace, clock signal 116. In such a case, FI 114 may periodically toggle values, randomly but intermittently suppress, or add noise to clock signal 116 to yield modified clock signal 118. During pass-through mode, FI 114 may be configured to route clock signal 116 to FSCM 110.

In a simplest implementation, FI 114 might be implemented with an OR gate. A high or low bit representing FSCM-test mode enabled or disabled, respectively, may be routed to one input of the OR gate. Clock signal 116 may be routed to another input of the OR gate. If FSCM-test mode is enabled, FI 114 may issue a constant "one" output. If pass-through mode is enabled, F1 114 may issue clock signal 116.

In one embodiment, during FSCM-test mode, other processor and peripherals of system 100 such as peripherals 106, 108, 112 may continue to operate as-if pass-through mode is utilized, using clock signal 116. FSCM-test mode may be performed after initialization, BIST, or start-up of system 100. FSCM-test mode may be performed at any suitable time during operation of system 100. FSCM-test mode may be performed periodically such as every or every other second, minute, hour, or day; periodically upon a certain number of clock cycles of operation of microcontroller 104; or upon demand by a user, a push-button, or function or signal issued by another component of system 100 that is performing real-time systems diagnostics. For example, on a consumer electronics device or an appliance, FSCM-test mode may be enabled upon engaging a motor. This may occur, for example, when pressing a "start" button on a washing machine. Only upon passing the verification of FSCM 110 may the washer be spun. FSCM-test mode may be initiated when other periodic, real-time diagnostics are performed, such as firmware or memory verification.

As discussed above, some corrective actions upon identification of a fault during FSCM-test mode may be suppressed. This arises from use of FSCM-test mode during real-time operation of system 100 wherein other peripherals such as peripherals 106, 108, 112 are still using clock signal 116. Thus, FSCM-test mode may be performed while altering other measures of system 100 that are performed when a clock failure is detected. For example, during pass-through mode FSCM 110 might generate a soft reboot upon detecting a clock failure. Thus, during FSCM-test mode, system 100 may be configured to suppress the reboot signal generated by FSCM 110. In another example, although the reboot signal is generated, recipients of the reboot signal may check the associated registers to identify whether FSCM-test mode is enabled, and thus ignore the soft reboot.

In one embodiment, system 100 may provide enhanced opportunities for Class B compliance by testing FSCM 110. FSCM 110 may be tested in real-time as-if oscillator 102 has stopped or is malfunctioning, but without having to actually stop or modify oscillator 102. Other peripherals and processors may continue to operate while FSCM 110 tested. The operation of these other peripherals and processors need not be disrupted.

FIG. 2 illustrates example operation of a system including an FSCM with fault injection, according to embodiments of the present disclosure. FIG. 2A may illustrate a test of FSCM 110 wherein FSCM 110 is working correctly. FIG. 2B may illustrate a test of FSCM 110 wherein FSCM 110 is working incorrectly. FIG. 2C may illustrate operation of FSCM 110 wherein oscillator 102 is working correctly. FIG. 2D may illustrate operation of FSCM 110 wherein oscillator 102 is working incorrectly.

Figure 2A:
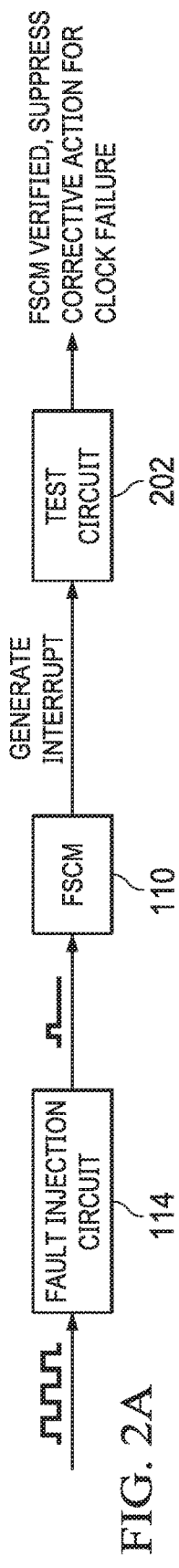
FIGS. 2A-2D illustrate example operation of a system including an FSCM with fault injection, according to embodiments of the present disclosure.

In FIG. 2A, system 100 may have enabled test-FSCM mode. FSCM 110 may be working correctly. Thus, pass-through mode may be disabled. Oscillator 102 may generate a clock signal. The clock signal may be a correct clock signal. FI 114 may modify or replace the clock signal received from oscillator 102 with an injected fault. The modified clock signal may be issued to FSCM 110. FSCM 110, working correctly, may identify the faulty nature of its received clock signal (the modified clock signal). Accordingly, FSCM 110 may generate an interrupt or other corrective action to other parts of system 100 with the identification of the faulty signal. The interrupt may be sent to or intercepted by control circuit 202. Control circuit 202 may be implemented by any suitable part of system 100 with analog circuitry, digital circuitry, instructions for execution by a processor, or a combination thereof. For example, control circuit 202 may implement an interrupt handler, debug engine, or fault module. Control circuit 202 may, based upon the interrupt, determine that FSCM 110 is working correctly. Other corrective actions that would be taken in response to clock failure or error may be suppressed.

Figure 2B:
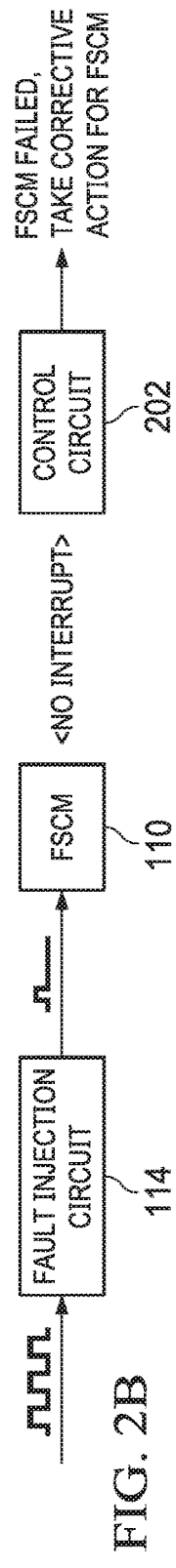

In FIG. 2B, system 100 may have enabled test-FSCM mode while FSCM may be incorrectly working. Pass-through mode may be disabled. Oscillator 102 may generate a clock signal. The clock signal may be a correct clock signal. FI 114 may modify or replace the clock signal received from oscillator 102 with an injected fault. The modified clock signal may be issued to FSCM 110. FSCM 110, working incorrectly, may fail to identify the faulty nature of its received clock signal (the modified clock signal). Accordingly, FSCM 110 might fail to generate an interrupt or other corrective action to other parts of system 100 with the identification of the faulty signal. Control circuit 202 may, based upon the lack of an expected interrupt, determine that FSCM 110 is working incorrectly. Corrective action for the FSCM 110 may be taken.

Figure 2C:
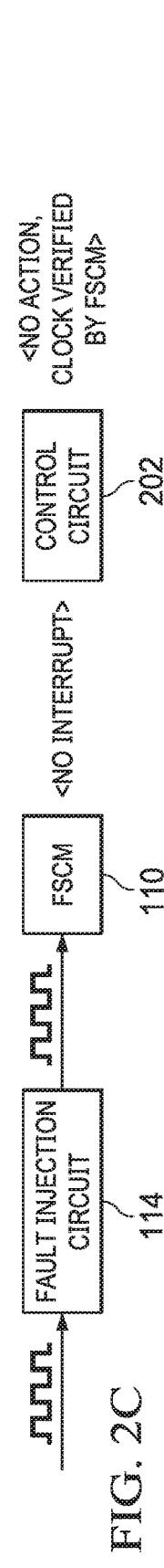

In FIG. 2C, system 100 may have disabled test-FSCM mode. Thus, pass-through mode may be enabled. Oscillator 102 may generate a clock signal. The clock signal may be a correct clock signal. FI 114 may pass the clock signal received from oscillator 102 through to FSCM 110. FSCM 110 may identify the correct nature of its received clock signal. FSCM 110 does not need to generate an interrupt or other corrective action to other parts of system 100 with the identification of the faulty signal. Control circuit 202 might not need to take corrective action.

Figure 2D:
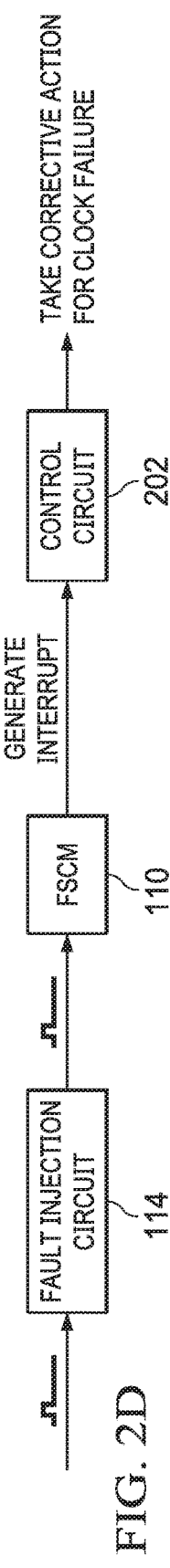

In FIG. 2D, system 100 may have disabled test-FSCM mode. Thus, pass-through mode may be enabled. Oscillator 102 may generate a clock signal. The clock signal may be an incorrect or faulty clock signal, or no signal might be sent at all. FI 114 may pass the clock signal received from oscillator 102 through to FSCM 110. FSCM 110 may identify the incorrect nature of its received clock signal. FSCM 110 may generate an interrupt or other corrective action to other parts of system 100 with the identification of the faulty signal. The interrupt may be sent to or intercepted by control circuit 202. Control circuit 202 may take corrective action for a faulty clock, or otherwise allow corrective actions that would have been taken in FIG. 2A.

Figure 3:
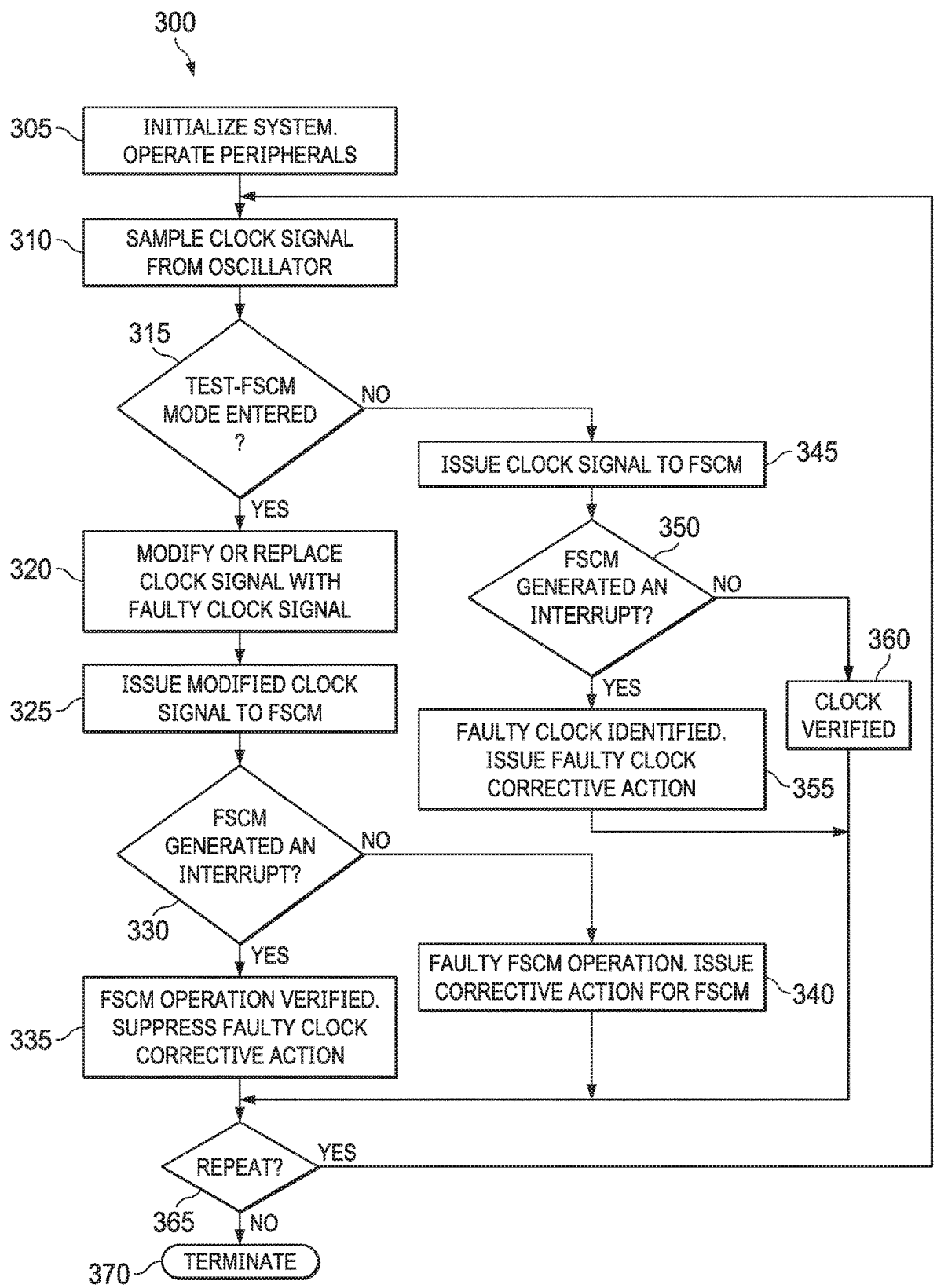
FIG. 3 illustrates a method of performing fault injection with an FSCM, according to embodiments of the present disclosure.

FIG. 3 illustrates a method 300 of performing fault injection with an FSCM, according to embodiments of the present disclosure. Method 300 may be initialized at any given point, such as 305. Method 300 may include more or fewer elements than those shown in FIG. 3. Method 300 may be performed by the elements of system 100. Method 300 may be implemented in part by instructions for execution by a processor, such as in firmware or software. Various elements of method 300 may be omitted, repeated, or performed in parallel with one another. Variations of the order of the elements of method 300 may be implemented.

At 305, a system may be initialized. Peripherals and processors in the system that use clock signals may be operating. These may continue to operate in parallel with the execution of the other steps of method 300.

At 310, a clock signal to be used by the peripherals may be sampled. The clock signal may be, for example faulty or dead, or correct.

At 315, if the clock signal is to be tested, it may be further determined whether a test-FSCM mode is to be entered wherein the FSCM is to itself be tested. In an alternate, pass-through mode, the FSCM is not to be tested itself but instead simply operated to test the clock signal. If the test-FSCM is enabled, method 300 may proceed to 320. Otherwise, method 300 may proceed to 345.

At 320, the received clock signal may be modified, cancelled, or replaced with a faulty clock signal. This may be, for example, a flat voltage value. At 325, the modified clock signal may be issued to the FSCM. The FSCM may analyze the modified clock signal to determine whether it operates within specified parameters of, for example, frequency. At 330, it may be determined whether, as a result of the FSCM's analysis, did the FSCM generate an interrupt or other corrective action identifying the modified clock signal as faulty. If the FSCM did identify the modified clock signal as faulty, method 300 may proceed to 335. Otherwise, method 300 may proceed to 340.

At 335, FSCM operation may be verified. Corrective actions for a faulty clock may be suppressed. Method 300 may proceed to 365.

At 340, FSCM operation may be identified as faulty. Corrective action for a faulty FSCM may be issued. Such corrective action may include warnings to users or further diagnostics. While a faulty FSCM does not necessarily imply a faulty clock signal, a faulty clock signal might not be detected. If an undetected faulty clock signal would be sufficiently dangerous, preemptive corrective action may be taken. For example, upon detection of a faulty FSCM, the oscillators evaluated by the faulty FSCM may be disused, and backup oscillators protected by other FSCM instances used instead. In another example, another FSCM may be switched to evaluate the given oscillator and the faulty FSCM instance disused. Method 300 may proceed to 365.

At 345, the clock signal sampled may be issued to the FSCM. The FSCM may evaluate whether the clock signal is of an expected or acceptable form. At 350, it may be determined whether the FSCM issued an interrupt or other notice or action indicating that the clock signal was faulty. If such an interrupt was generated, method 300 may proceed to 355. Otherwise, method 300 may proceed to 360.

At 350, it may be determined, based upon the evaluation by the FSCM, that the clock is faulty. Corrective action for the faulty clock may be issued. In one embodiment, the corrective action for the faulty clock may be different than the corrective action for the faulty FSCM. In another embodiment, the corrective action for the faulty clock and the corrective action for the faulty FSCM may overlap or be the same. Method 300 may proceed to 365.

At 355, it may be determined, based upon the evaluation by the FSCM, that the clock is working correctly. No corrective action need be taken. Method 300 may proceed to 365.

At 365, method 300 may optionally repeat at, for example, 310, or may terminate at 370.

Although example embodiments have been described above, other variations and embodiments may be made from this disclosure without departing from the spirit and scope of these embodiments.

The invention claimed is:

1. A system for testing a clock monitor, comprising:
 a fault injection circuit with an input communicatively coupled to a clock source;
 a control circuit; and
 a clock monitor circuit communicatively coupled to an output of the fault injection circuit and to an input of the control circuit, the clock monitor circuit configured to evaluate a clock source signal from the clock source;
 wherein:
  the fault injection circuit is configured to:
   modify or replace the clock source signal from the clock source to yield a modified clock signal; and
   send the modified clock signal to the clock monitor circuit;
  the clock monitor circuit is configured to:
   receive an input clock signal;
   determine whether the input clock signal indicates a faulty clock source; and
    issue a clock corrective action based upon a determination that the input clock signal indicates a faulty clock source; and
  the control circuit is configured to:
   monitor for the clock corrective action; and
   determine based on whether the clock corrective action is issued whether the clock monitor circuit is operating correctly.

2. The system of claim 1, wherein the control circuit is further configured to determine that the clock monitor is operating correctly based upon the clock monitor circuit issuing the clock corrective action.

3. The system of claim 1:
 further comprising a peripheral circuit;
 wherein the peripheral circuit is configured to use the clock source signal while the fault injection circuit sends the modified clock signal to the clock monitor circuit.

4. The system of claim 1, wherein the fault injection circuit is further configured to selectively modify or replace the clock source signal from the clock source to yield a modified clock signal based upon a clock monitor testing mode for the system, wherein the clock monitor circuit is to be tested during the clock monitor testing mode.

5. The system of claim 4, wherein the control circuit is further configured to monitor for the clock corrective action and determine whether the clock monitor circuit is operating correctly based upon the clock monitor testing mode.

6. The system of claim 4, wherein the clock monitor circuit is configured to evaluate the modified clock signal as its input clock signal during the clock monitor testing mode.

7. The system of claim 1, wherein the fault injection circuit is further configured to selectively forward the clock source signal instead of the modified clock signal to the clock monitor circuit in a pass-through mode.

8. The system of claim 7, wherein during the pass-through mode the control circuit is further configured to determine, from clock corrective action issued by the clock monitor circuit, that the clock source is faulty.

9. The system of claim 7, wherein the clock monitor circuit is configured to evaluate the clock source signal as its input clock signal during the pass-through mode.

10. The system of claim 1, wherein the control circuit is configured to suppress clock corrective action to be taken on other elements of the system based upon the clock monitor circuit issuing the clock corrective action after evaluating the modified control signal.

11. A method for testing a clock monitor, comprising:
 operating a fault injection circuit with an input communicatively coupled to a clock source;
 operating a control circuit; and
 receiving a clock source signal from the clock source;
 modifying or replace the clock source signal from the clock source to yield a modified clock signal;
 sending the modified clock signal to a clock monitor circuit communicatively coupled to an output of the fault injection circuit and to an input of the control circuit;
 at the clock monitor circuit:
  receiving an input clock signal;

determining whether the input clock signal indicates a faulty clock source; and issuing a clock corrective action based upon a determination that the input clock signal indicates a faulty clock source; and monitoring for the clock corrective action; and determining based on whether the clock corrective action is issued whether the clock monitor circuit is operating correctly.

12. The method of claim 11, further comprising determining that the clock monitor is operating correctly based upon the clock monitor circuit issuing the clock corrective action.

13. The method of claim 11, further comprising operating a peripheral circuit with the clock source signal while the modified clock signal is routed to the clock monitor circuit.

14. The method of claim 11, further comprising selectively modifying or replacing the clock source signal from the clock source to yield a modified clock signal based upon a clock monitor testing mode for the method, wherein the clock monitor circuit is to be tested during the clock monitor testing mode.

15. The method of claim 14, further comprising monitoring for the clock corrective action and determining whether the clock monitor circuit is operating correctly based upon the clock monitor testing mode.

16. The method of claim 14, further comprising evaluating the modified clock signal as an input clock signal for the clock monitor circuit during the clock monitor testing mode.

17. The method of claim 11, further comprising selectively forwarding the clock source signal instead of the modified clock signal to the clock monitor circuit in a pass-through mode.

18. The method of claim 17, further comprising, during the pass-through mode, determining, from clock corrective action issued by the clock monitor circuit, that the clock source is faulty.

19. The method of claim 17, further comprising evaluating the clock source signal as an input clock signal for the clock monitor circuit during the pass-through mode.

20. The method of claim 11, further comprising suppressing clock corrective action to be taken on other elements of the system based upon the clock monitor circuit issuing the clock corrective action after evaluating the modified control signal.

* * * * *